United States Patent

Frank

(10) Patent No.: US 7,573,350 B2
(45) Date of Patent: Aug. 11, 2009

(54) RESONATOR MATCHING NETWORK

(75) Inventor: Michael Louis Frank, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 2 days.

(21) Appl. No.: 11/779,675

(22) Filed: Jul. 18, 2007

(65) Prior Publication Data

US 2008/0012659 A1    Jan. 17, 2008

Related U.S. Application Data

(63) Continuation of application No. 11/104,605, filed on Apr. 13, 2005, now Pat. No. 7,274,270.

(51) Int. Cl.
*H03H 7/38* (2006.01)
*H03H 9/54* (2006.01)
*H03H 9/64* (2006.01)

(52) U.S. Cl. .................. 333/32; 333/187; 333/193

(58) Field of Classification Search .......... 333/193, 333/133, 187, 189, 32, 33
See application file for complete search history.

(56) References Cited

U.S. PATENT DOCUMENTS

| | | | |
|---|---|---|---|
| 5,592,135 A | 1/1997 | Taguchi et al. | |
| 5,604,393 A | 2/1997 | Suzuki et al. | |
| 5,910,756 A | 6/1999 | Ella | |
| 6,023,611 A | 2/2000 | Bolin et al. | |
| 6,262,637 B1 * | 7/2001 | Bradley et al. | 333/133 |
| 6,472,954 B1 | 10/2002 | Ruby et al. | |
| 6,483,402 B2 | 11/2002 | Endoh et al. | |
| 6,489,862 B1 | 12/2002 | Frank | |
| 6,670,866 B2 | 12/2003 | Ella et al. | |
| 6,713,940 B2 | 3/2004 | Takamine | |
| 6,744,333 B2 | 6/2004 | Sawada | |
| 7,031,689 B2 | 4/2006 | Frank | |
| 7,084,718 B2 | 8/2006 | Nakamura et al. | |
| 7,098,758 B2 * | 8/2006 | Wang et al. | 333/189 |
| 7,102,460 B2 | 9/2006 | Schmidhammer et al. | |
| 7,356,314 B2 * | 4/2008 | Forrester et al. | 455/103 |
| 2004/0051601 A1 | 3/2004 | Frank | |
| 2004/0196119 A1 * | 10/2004 | Shibahara et al. | 333/193 |

FOREIGN PATENT DOCUMENTS

WO    WO 2004/093315    * 10/2004

* cited by examiner

*Primary Examiner*—Barbara Summons

(57) ABSTRACT

An input-matching network including an acoustic resonator providing a virtual impedance to match impedance between a first component and second component. As an example, the first component may be an antenna and the second component may be an amplifier. The acoustic resonator provides a virtual impedance to match impedance between the antenna and the amplifier. The acoustic resonator may be, for example, a film bulk acoustic (fbar) resonator or a surface acoustic wave (saw) resonator.

4 Claims, 5 Drawing Sheets

RESONATOR MATCHING NETWORK

CROSS-REFERENCE TO RELATED APPLICATIONS

This is a continuation of Ser. No. 11/104,605, now U.S. Pat. No. 7,274,270 to Michael Louis Frank filed Apr. 13, 2005, for RESONATOR MATCHING NETWORK, the entire disclosure of which is hereby incorporated by reference herein.

BACKGROUND OF THE INVENTION

Description of the Related Art

In radios that consist of a receiver and a transmitter, both are connected to an antenna. The receiver input is typically a low noise amplifier. The low noise amplifier sets an amount of noise that the receiver adds to a wanted signal. The low noise amplifier is thereby critical to a performance of the radio. The input equivalent circuit of the low noise amplifier is capacitive.

The low noise amplifier should use as little current as possible in cases where the radio is battery powered. Reducing the current makes the impedance of the low noise amplifier equivalent to an increasingly smaller capacitor. This impedance becomes increasingly difficult to match. The impedance of the low noise amplifier must be matched to the impedance of the antenna in order to minimize the noise added to the received signal.

FIG. 1 illustrates a conventional input-matching network using a biasing circuit. Referring to FIG. 1, an antenna $A_1$ is provided in a network to receive a signal. A capacitor $C_{11}$ is connected at one end of the antenna $A_1$. An inductor $L_1$ is connected at the other end of the capacitor $C_{11}$ opposite the end that is connected to the antenna $A_1$. A transistor $T_{12}$ is connected at an end of the inductor $L_1$, opposite the end of the inductor $L_1$ connected to the capacitor $C_{11}$. The transistor $T_{12}$ is grounded at one end thereof and connected to another transistor $T_{11}$ at the other end to a transistor $T_{12}$ to form a cascode arrangement. In the embodiment in FIG. 1, the transistors $T_{11}$, $T_{12}$ are shown as CMOS type transistors. However, the transistors $T_{11}$, $T_{12}$ may be any type of transistors.

A capacitor $C_{12}$ is connected at one end thereof to the transistor $T_{11}$ and to an antenna A1 at the other end thereof. At the other end of the transistor $T_{12}$ opposite the end connected to the transistor $T_{11}$, is connected a current source $I_1$. A signal $S_1$ is delivered through the antenna A1 and is amplified by the transistor $T_{11}$. A power source $P_1$ is connected at an end of the current source $I_1$ opposite the end connected to the transistor $T_{11}$.

As shown in FIG. 1, the capacitive structure may be transformed to a real impedance of the antenna $A_1$ by using the series inductor $L_1$. However, using the inductor $L_1$ may cause problems. For example, as the low noise amplifier current is reduced, the capacitance of the low noise amplifier is also reduced, and a required value inductance increases. Several effects may occur as a result of using the inductor $L_1$. For example, the series resistance of the inductor $L_1$ increases, increasing the loss of the input-matching network, and thereby increasing the noise added to the wanted signal. Also, the inductor $L_1$ gets physically large and thereby, more expensive and difficult to fit into the input-matching network. Further, a self-resonant frequency generally decreases to a frequency below a desired operation, and thus, does not operate as an inductor at that frequency. The self-resonance would require that a different type of inductor be used such as an off-chip component or a higher performing and more expensive inductor.

BRIEF DESCRIPTION OF THE DRAWINGS

Aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
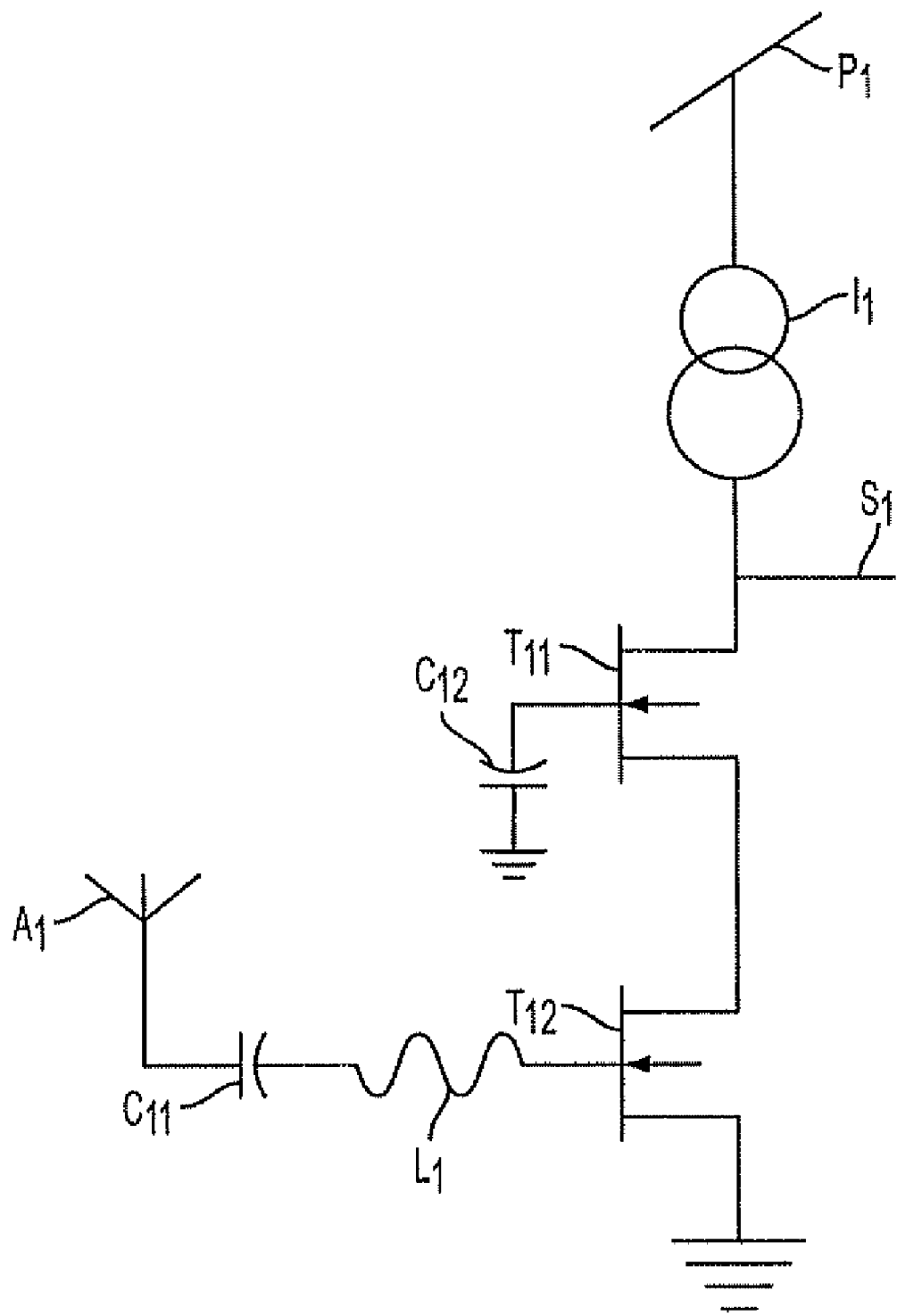
FIG. 1 illustrates a conventional input-matching network using a biasing circuit.

Reference will now be made in detail to the embodiments of the present invention, examples of which are illustrated in the accompanying drawings, wherein like reference numerals refer to like elements throughout. The embodiments are described below in order to explain the present invention by referring to the figures.

In the present invention, an acoustic resonator provides a virtual inductance that matches a capacitive impedance to a real impedance. For example, an acoustic resonator having a virtual inductance may be provided in an input-matching network that matches a capacitive impedance of a transistor to a real impedance of an antenna. The acoustic resonator substitutes for an inductor that may be very large, very lossy, or both. The acoustic resonator also eliminates the need for a blocking capacitor, which is often required in conventional type input-matching networks to maintain proper biasing.

Figure 2A:
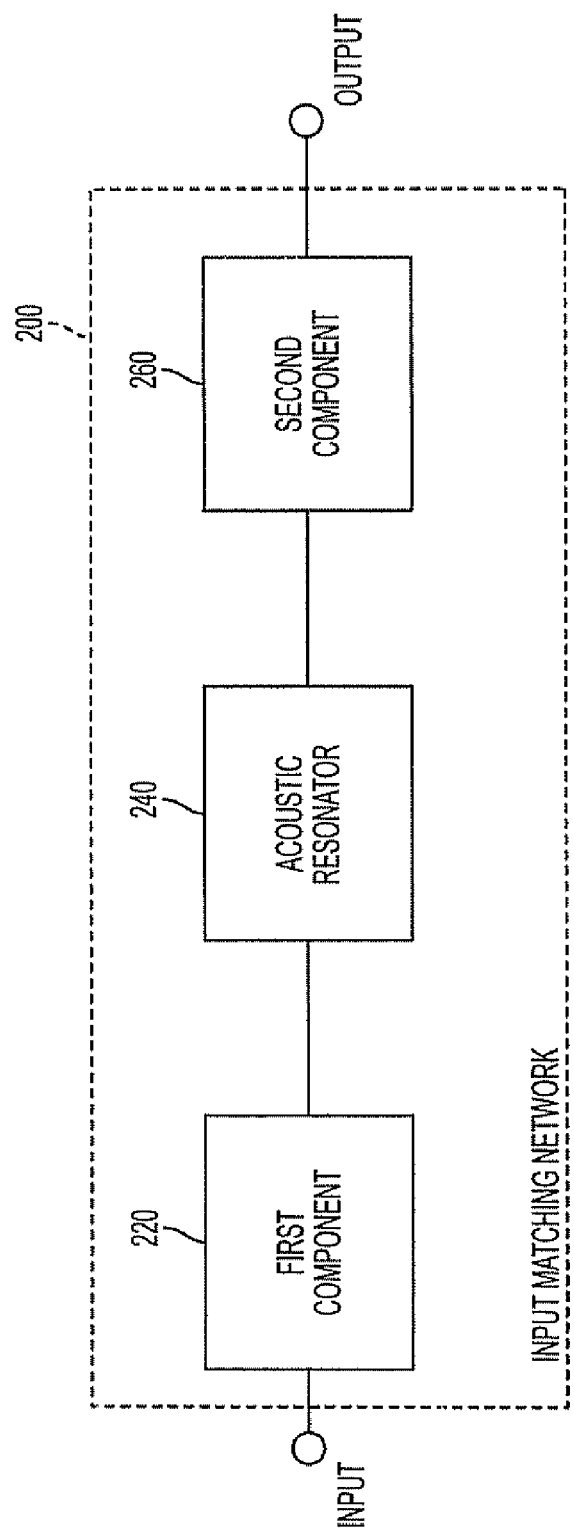
FIG. 2A illustrates an input-matching network, according to an embodiment of the present invention.

FIG. 2A illustrates an input-matching network, according to an embodiment of the present invention. Referring to FIG. 2A, the input-matching network 200 includes an acoustic resonator 240 to match impedance between a first component 220 and a second component 260. The acoustic resonator 240, for example, may be a film bulk acoustic (fbar) or a surface acoustic wave (saw) resonator. However, the present invention is not limited to any specific type of acoustic resonator, and various different types of acoustic resonators may be used in the invention.

The acoustic resonator 240 provides a virtual inductance to match the impedance between the first component 220 and the second component 260. The first component 220 may be, for example, an oscillator, a mixer, a filter, an amplifier, a transmitter, a receiver, or an antenna. Similarly, the second component 260 may be, for example, an oscillator, a mixer, a filter, an amplifier, a transmitter, a receiver or an antenna. For example, the acoustic resonator 240 may provide a virtual inductance to match the impedance between the first component 220 being an antenna and the second component 260 being an amplifier. However, the present invention is not limited to the first component 220 and/or the second component 260 being any particular type of component.

The network 200 includes an input and an output. The first component 220 is connected at one end thereof to the input of the network 200, and is connected at the other end thereof to the acoustic resonator 240. The acoustic resonator 240 is connected at an end thereof to the first component 220, and is connected at the other thereof to the second component 260. The second component 260 is connected at an end thereof to the acoustic resonator 240, and is connected at the other end thereof to the output of the network 200.

Therefore, the acoustic resonator 240 provides a virtual inductance and thereby operates as an impedance matching network to match impedance between the first component 220 and the second component 260.

Figure 2B:
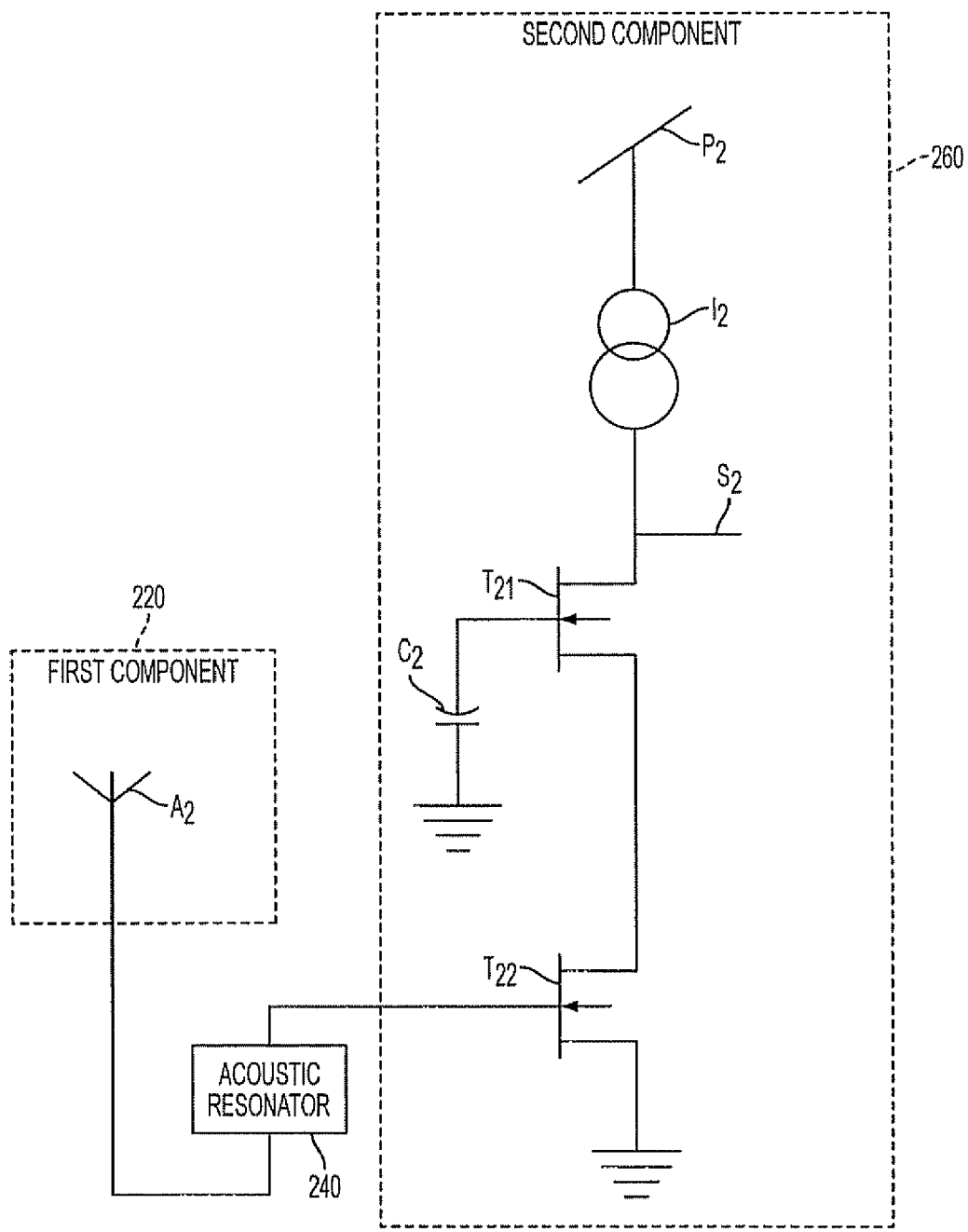
FIG. 2B illustrates an input-matching network, according to an embodiment of the present invention.

FIG. 2B illustrates an input-matching network matching impedance between specific examples of a first component 220 and a second component 260, according to an embodiment of the present invention. Referring to FIG. 2B, the input-match network 200 includes the acoustic resonator 240 having a virtual inductance to match impedance between the first component 220 and the second component 260. The acoustic resonator 240 is connected at one end thereof to the first component 220 and is connected at the other end to the second component 260. In the specific example shown in FIG. 2B, the first component 220 is an antenna and the second component 260 is a transistor-amplifier.

More specifically, as shown in the specific example in FIG. 2B, the first component 220 includes an antenna $A_2$. The acoustic resonator 240 is connected at one end to the antenna $A_1$. The second component 260 includes a transistor-amplifier circuit and is connected to the other end of the acoustic resonator 240. The transistor-amplifier circuit includes transistors $T_{21}$, $T_{22}$, a capacitor $C_2$, a current source $I_2$, a signal $S_2$, and power source $P_2$. The transistors $T_{21}$, $T_{22}$ form a cascode arrangement and are shown, in FIG. 2B, as CMOS type transistors. However, the present invention is not limited to any specific type of transistor.

Of course, the present invention is not limited to the specific example in FIG. 2A where the first component 220 is an antenna and/or the second component 260 is a transistor amplifier. Instead, as indicated above, the first component 220 and/or the second component 260 are not limited to being any particular type of component. In addition, although a specific type of amplifier with a specific configuration is shown in FIG. 2B, the present invention is not limited to an amplifier being any specific type or configuration of amplifier.

Figure 3:
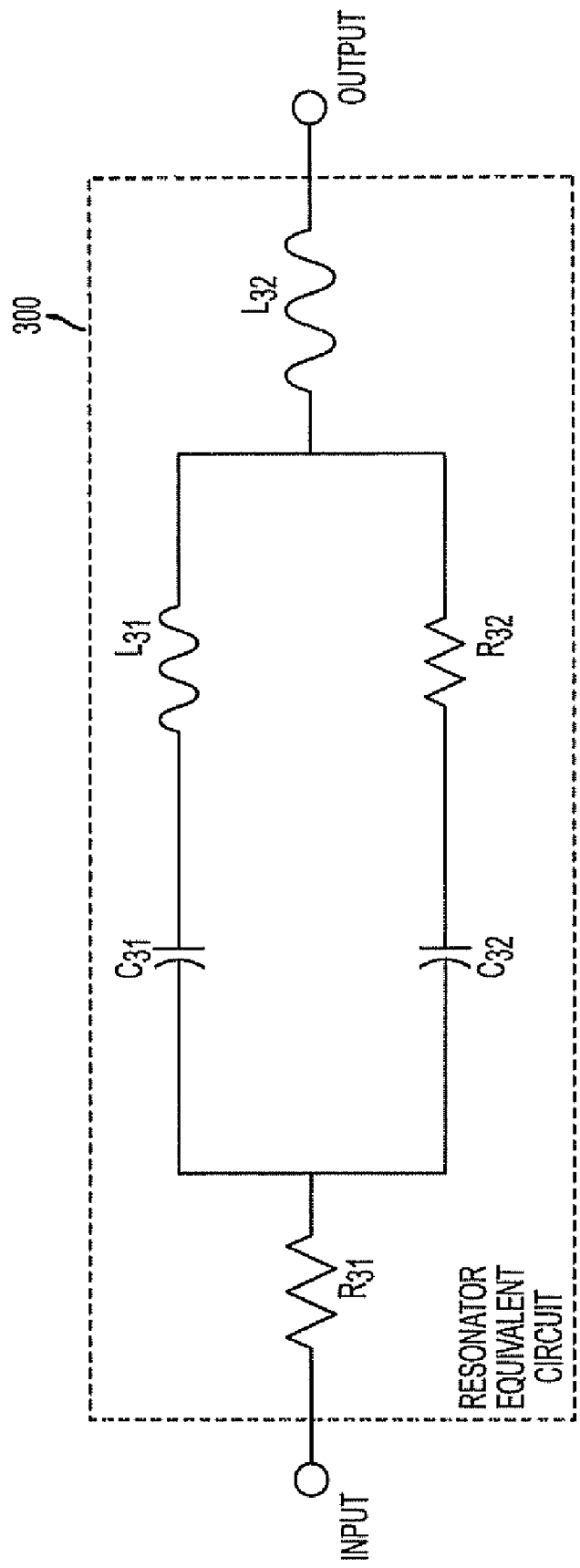
FIG. 3 illustrates is a configuration of a resonator equivalent circuit of an acoustic resonator, according to an embodiment of the present invention.

FIG. 3 illustrates is a configuration of a resonator equivalent circuit of the acoustic resonator 240, according to an embodiment of the present invention. Referring to FIG. 3, the resonator equivalent circuit 300 includes two resistors ($R_{31}$, $R_{32}$), two capacitors ($C_{31}$, $C_{32}$), and two inductors ($L_{31}$, $L_{32}$). Acoustic resonators such as fbar or saw resonators, for example, are equivalent to an inductor-capacitor (LC) network that is used in an input-matching network. The fbar and saw resonators may be used even though there is no actual inductor. For example, the inductor $L_{31}$ in the resonator equivalent circuit 300 has a virtual inductance. Although the resonator equivalent circuit 300 has only a small, incidental parasitic inductance $L_{32}$, the acoustic resonator 240, for example, may be controlled to create the virtual inductance required to match impedance between the first component 220 and the second component 260.

Figure 4:
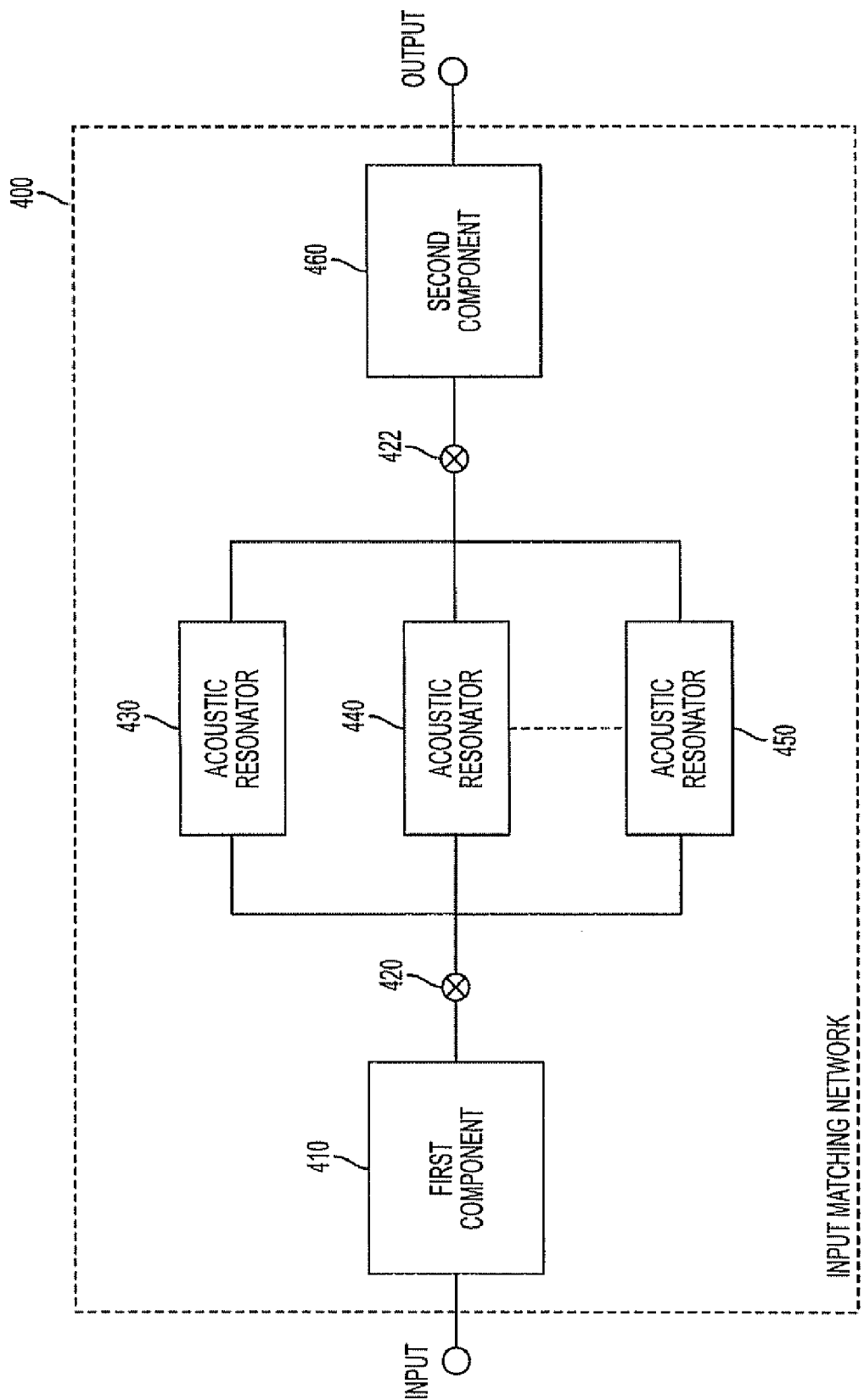
FIG. 4 illustrates an input-matching network, according to an embodiment of the present invention.

FIG. 4 illustrates an input-matching network, according to an embodiment of the present invention. Referring to FIG. 4, the input-matching network 400 includes a plurality of electronically selectable acoustic resonators 430, 440, and 450. A respective acoustic resonator of the plurality of electronically selectable acoustic resonators 430, 440, and 450 is selected to match impedance between a first component 410 and a second component 460. Each of the plurality of acoustic resonators 430, 440, and 450 provides a different virtual inductance to match the impedance between the first component 410 and the second component 460.

The input-matching network 400 also includes switches 420 and 422 electronically selecting the respective acoustic resonator of the plurality of electronically selectable acoustic resonators 430, 440, and 450 to match impedance between the first component 410 and the second component 460. The impedance required to match the first component 410 to the second component 460, for example, may depend on a frequency received by the antenna $A_2$.

The acoustic resonators 430, 440, and 450, for example, may be an fbar or a saw type acoustic resonator. However, the present invention is not limited to any specific type of acoustic resonator, and various different types of acoustic resonators may be used in the invention. The first component 410 and the second component 460 may be one of an oscillator, mixer, filter, transmitter, receiver, and antenna. However, the present invention is not limited to any particular type of component in an input-matching network.

The network 400 includes an input and an output. The first component 410 is connected at one end thereof to the input of the network 400, and is connected at the other end thereof to the switch 420. The acoustic resonators 430, 440, and 450 are connected at one end of the acoustic resonators 430, 440, and 450 to the switch 420, and are connected at the other of the acoustic resonators 430, 440, and 450 to the switch 422. The second component 460 is connected at an end thereof to the switch 422, and is connected at the other end thereof to the output of the network 400.

The switches 420 and 422, for example, may be transistor switches. The switches 420 and 422 allow a signal to be transmitted through a respective one of the acoustic resonators 430, 440, or 450 to match the first component 410 and the second component 460. For example, if the acoustic resonator 430 is selected to match impedance between the first component 410 and the second component 460, the switches 420 and 422 are controlled so that a signal is transmitted through the acoustic resonator 430. If the acoustic resonator 440 is selected to match impedance between the first component 410 and the second component 460, the switches 420 and 422 are controlled so that a signal is transmitted through the acoustic resonator 440. If the acoustic resonator 550 is selected to match impedance between the first component 410 and the second component 460, the switches 420 and 422 are controlled so that a signal is transmitted through the acoustic resonator 450.

Although FIG. 4 shows the use of three acoustic resonators, the present invention is not limited to any particular number of acoustic resonators from which a respective acoustic resonator can be selected. For example, a respective acoustic resonator may be selected, for example, from among two, four, five or more acoustic resonators providing different amounts of virtual inductance.

Moreover, there are many different switch configurations and manners of selecting or switching to a respective acoustic resonator. The present invention is not limited to the use of two switches in the manner shown in FIG. 4.

In addition, a circuit configuration may be implemented so that a signal automatically flows through an appropriate acoustic resonator of a plurality of parallel acoustic resonators in accordance with electrical principles of components in the circuit configuration, the values of the virtual inductances provided by the acoustic resonators, and the frequency of the signal.

Further, a virtual inductance is a function of a size and thickness of an acoustic resonator. Accordingly, the size and thickness of an acoustic resonator may be designed to provide the virtual inductance necessary to match the required impedance between components.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An input-matching network, comprising:
   an oscillator;
   an antenna; and
   an acoustic resonator selected to provide impedance matching between the oscillator and the antenna, wherein the acoustic resonator provides a virtual inductance to match the impedance between the oscillator and the antenna.

2. An input-matching network as claimed in claim 1, wherein the acoustic resonator is a film bulk acoustic (FBAR) resonator.

3. The input-matching network as claimed in claim 1, wherein the acoustic resonator is a surface acoustic wave (SAW) resonator.

4. An input-matching network, comprising:
   a transistor-amplifier;
   an antenna; and
   a film bulk acoustic resonator (FBAR) selected to provide impedance matching between the transistor amplifier and the antenna, wherein the acoustic resonator provides a virtual inductance to match the impedance between the transistor-amplifier and the antenna.

* * * * *